(12) United States Patent
Terashima

(10) Patent No.: US 8,686,378 B2
(45) Date of Patent: Apr. 1, 2014

(54) CHARGED PARTICLE BEAM DRAWING APPARATUS, AND METHOD OF MANUFACTURING ARTICLE

(75) Inventor: Shigeru Terashima, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/550,702

(22) Filed: Jul. 17, 2012

(65) Prior Publication Data

US 2013/0040240 A1    Feb. 14, 2013

(30) Foreign Application Priority Data

Aug. 12, 2011    (JP) .................................. 2011-177251

(51) Int. Cl.
*H01J 37/12*    (2006.01)
*H01J 7/22*    (2006.01)

(52) U.S. Cl.
USPC ..................................... 250/492.2; 250/492.3

(58) Field of Classification Search
USPC ................................ 250/492.1–492.22, 492.3
See application file for complete search history.

(56) References Cited

U.S. PATENT DOCUMENTS

| | | | |
|---|---|---|---|
| 6,603,128 B2 | 8/2003 | Maehara et al. | |
| 2002/0005491 A1* | 1/2002 | Yagi et al. | 250/396 ML |
| 2003/0189180 A1* | 10/2003 | Hamaguchi et al. | 250/492.3 |
| 2005/0077475 A1* | 4/2005 | Nagae et al. | 250/396 R |
| 2006/0138343 A1* | 6/2006 | Nakasuji et al. | 250/440.11 |

FOREIGN PATENT DOCUMENTS

JP    3728217 B2    12/2005

* cited by examiner

*Primary Examiner* — Robert Kim
*Assistant Examiner* — David E Smith
(74) *Attorney, Agent, or Firm* — Rossi, Kimms McDowell LLP

(57) ABSTRACT

A charged particle beam drawing apparatus includes an electrostatic lens including an electrode member and configured to project the plurality of charged particle beams onto the substrate via the electrode member. In the electrode member are formed a plurality of first openings via which the plurality of charged particle beams pass, and a plurality of second openings different from the plurality of first openings, a total area of the plurality of second openings being not smaller than a total area of the plurality of first openings.

9 Claims, 5 Drawing Sheets

F I G. 1
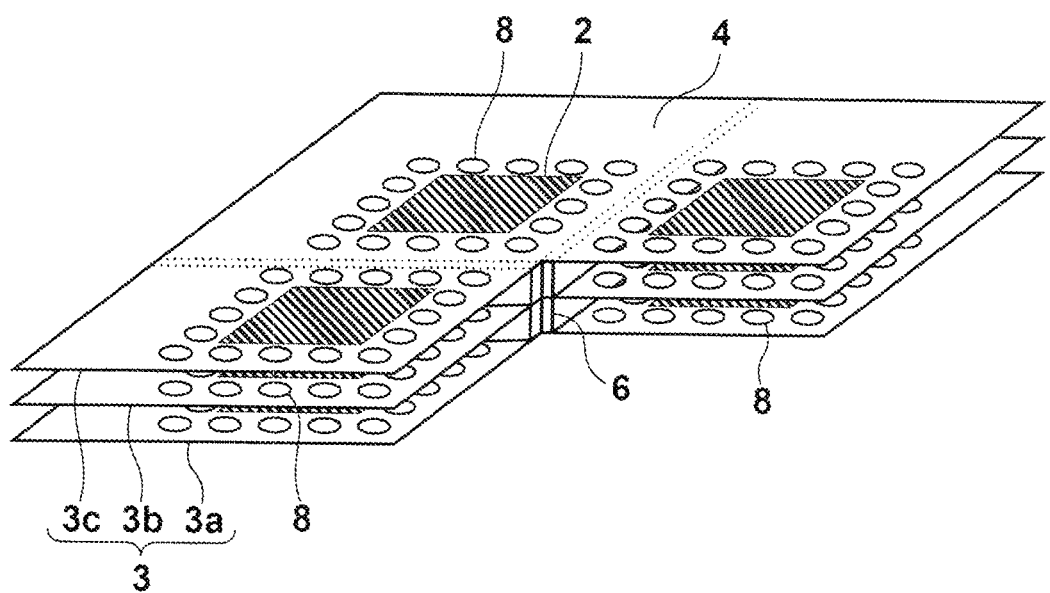

CHARGED PARTICLE BEAM DRAWING APPARATUS, AND METHOD OF MANUFACTURING ARTICLE

BACKGROUND OF THE INVENTION

1. Field of the Invention

The present invention relates to a charged particle beam drawing apparatus, and a method of manufacturing an article.

2. Description of the Related Art

To miniaturize a semiconductor circuit, a multibeam drawing apparatus must form an ultrafine pattern, so an electron beam is focused on a substrate to a diameter of about 10 nm. To do this, the final electrostatic lens which focuses an electron beam must have a focal length as short as, for example, about 1 mm or less. Since the electrostatic lens is formed by three electrode plates, the distance between a resist and the electrode plate closest to the resist is 0.5 mm or less when each electrode plate has a thickness of 0.2 mm. This electrostatic lens is arranged in a one-to-one correspondence with the electron beam. To efficiently draw a pattern, the multibeam drawing apparatus uses several tens of thousands of electron beams. To form images of these several tens of thousands of electron beams, the electrostatic lens is formed by electrode plates, including holes through which electron beams equal in number to the holes pass. These large numbers of electron beams are guided at an interval of, for example, 0.05 mm. Hence, if a total of 250 thousand electron beams are used, electrostatic lenses are arranged in a number corresponding to the 500×500 beams. The electrostatic lenses must have an area of 25 mm×25 mm (by simple arithmetic). However, to individually control the 250 thousand electron beams, the region to be irradiated with them is divided into blocks, each of which having an area of, for example, 5 mm×5 mm for the sake of convenience, e.g. for wiring. In one block, 100× 100 electrostatic lenses are arranged. Although the electron beams can be divided by various methods, they are often guided at an interval of, for example, 5 mm, so as to efficiently draw a pattern. As a result, the electron beams are distributed into 25 blocks arranged in an area of 45 mm×45 mm. This makes it necessary to use, for example, a frame which holds these electrode plates, so the surface of an electron beam lens barrel that is opposed to the wafer, has a size of at least about 50 mm×50 mm. The wafer to be exposed has a diameter of about 300 mm, so the wafer and the electrode plate are opposed to each other in a wide area at an interval of 0.2 mm.

FIG. 7 shows a perspective view of one block of electrostatic lenses in the prior art. Referring to FIG. 7, 10,000 openings 1, which form lenses for focusing 100×100 beams, are formed in a first region 2, through which charged particle beams pass and which are indicated by a gray portion. FIG. 7 shows on the upper left side a sectional enlarged view of an elliptical portion in the lower view of FIG. 7. As shown in the enlarged view of FIG. 7, three electrode plates 3a, 3b, and 3c in which openings 1, each of which has a diameter of 0.05 mm and forms the electrostatic lens, are equidistantly arrayed, are arranged with spacers 6 between them. Because all the electrode plates 3a, 3b, and 3c have a thickness of about 0.2 mm, the openings 1, each with a diameter of 0.05 mm, have a cylindrical shape. The openings 1 which form the electrostatic lens are arrayed in a 100×100 matrix within the block so as to form an opening group; a second region 4 in the white background around the opening group includes no openings because no charged particle beams pass through it. When 5×5 blocks are arranged, electrostatic lenses are arranged in a number corresponding to a total of 250,000 beams.

Since a charged particle beam is scattered and also considerably attenuated by the gas components present in the atmospheric air, an electron optical system which controls a charged particle beam in a charged particle beam drawing apparatus is maintained in a vacuum so as to prevent the attenuation of the charged particle beam. The gap between the wafer and the electrode plate is similarly maintained in a vacuum. When the charged particle beam drawing apparatus starts to draw using a charged particle beam, it irradiates the resist coated on the wafer with the charged particle beam. Bonds of molecules that compose the resist in the portion irradiated with the charged particle beam temporarily break. Depending on the type of resist, the cross-linking reaction then progresses, so a difference in molecular state occurs between the position irradiated with the charged particle beam and that which is not irradiated with the charged particle beam, thereby forming a drawing pattern. When the molecular state changes upon the irradiation of the resist with the charged particle beam, the resist constituent material partially vaporizes and is outgassed from the resist.

The moment the resist is irradiated with a charged particle beam, a large amount of components mixed with organic components are outgassed from the resist. Even after completion of the irradiation of the resist with the charged particle beam, the resist continues to release outgassed components while its decomposition reaction progresses. The dwell time for which the residual gas remains is determined depending on the gas exhaust capacity of the resist periphery. The wafer and the electrode plate opposed to it are opposed at an interval of 0.2 mm in an area of, for example, about 50 mm×50 mm, as described earlier. In this state, when the resist on the wafer is irradiated with a charged particle beam, some decomposed molecules are outgassed from the resist and fill the space between the wafer and the electrode plate. It takes much time for components outgassed from the resist to pass through the gap between the wafer and the electrode plate and migrate horizontally outwards. Some components of the gas pass through each opening in the electrostatic lens and migrate to the side (upwards) opposite to the electrostatic lens when viewed from the wafer, but this amount is relatively small. Furthermore, because the irradiation with the charged particle beam continues, components outgassed from the resist remain in the space between the wafer and the electrode plate. As a result, the pressure in this space rises. Since most resists contain organic substances, organic molecules outgassed from the resist remain in this space and therefore adhere to and deposit on the surface of the electrode plate. This phenomenon is considered to happen as secondary electrons generated by the wafer surface irradiated with the charged particle beam reach the electrode plate opposed to the wafer, and act on organic molecules physically absorbed in the wafer to combine the organic molecules with the surface of the electrode plate. When the opening shapes of the electrostatic lenses change upon deposition of the organic molecules on the electrode plate of the electrostatic lenses, the focal point or focal state of the charged particle beam also changes, so the drawing accuracy degrades. Also, when the deposited organic molecules are charged by the secondary electrons, the electric field in the electrostatic lenses is disturbed, so the position of the focal point or focal state of the charged particle beam deviates. This also adversely affects the drawing accuracy.

Further, a voltage as high as several kilovolts is applied to the electrode plates of the electrostatic lenses so as to focus the charged particle beam. Therefore, when components outgassed from the resist remain, the degree of vacuum in the space in which the electrostatic lenses are arranged decreases, leading to discharge between the electrode plates. Japanese Patent No. 3728217 discloses a method of exhausting the residual gas remaining between the electrode plates of the electrostatic lenses. In the method disclosed in Japanese Patent No. 3728217, exhaust ports and valves for exhausting the gas in the spaces formed by the opposed electrode plates are arranged in a number corresponding to the number of spaces. This method is effective in exhausting the residual gas remaining between the electrode plates. However, when the interval between the electrode plates is very narrow or wide and the pressure of the residual gas or remaining gas is 1 Pa or less, it is so difficult to increase the conductance that the exhaust capacity does not always improve, so the efficacy of this method is poor.

SUMMARY OF THE INVENTION

The present invention provides, for example, a drawing apparatus advantageous in reduction of influence of outgassing from a resist.

The present invention in its one aspect provides a drawing apparatus which performs drawing on a substrate with a plurality of charged particle beams in vacuum, the apparatus comprising: an electrostatic lens including an electrode member, and configured to project the plurality of charged particle beams onto the substrate via the electrode member, wherein in the electrode member are formed a plurality of first openings via which the plurality of charged particle beams pass, and a plurality of second openings different from the plurality of first openings, a total area of the plurality of second openings being not smaller than a total area of the plurality of first openings.

Further features of the present invention will become apparent from the following description of exemplary embodiments with reference to the attached drawings.

BRIEF DESCRIPTION OF THE DRAWINGS

FIG. 1 is a perspective view showing an electrostatic lens in the first embodiment;

DESCRIPTION OF THE EMBODIMENTS

Figure 6:
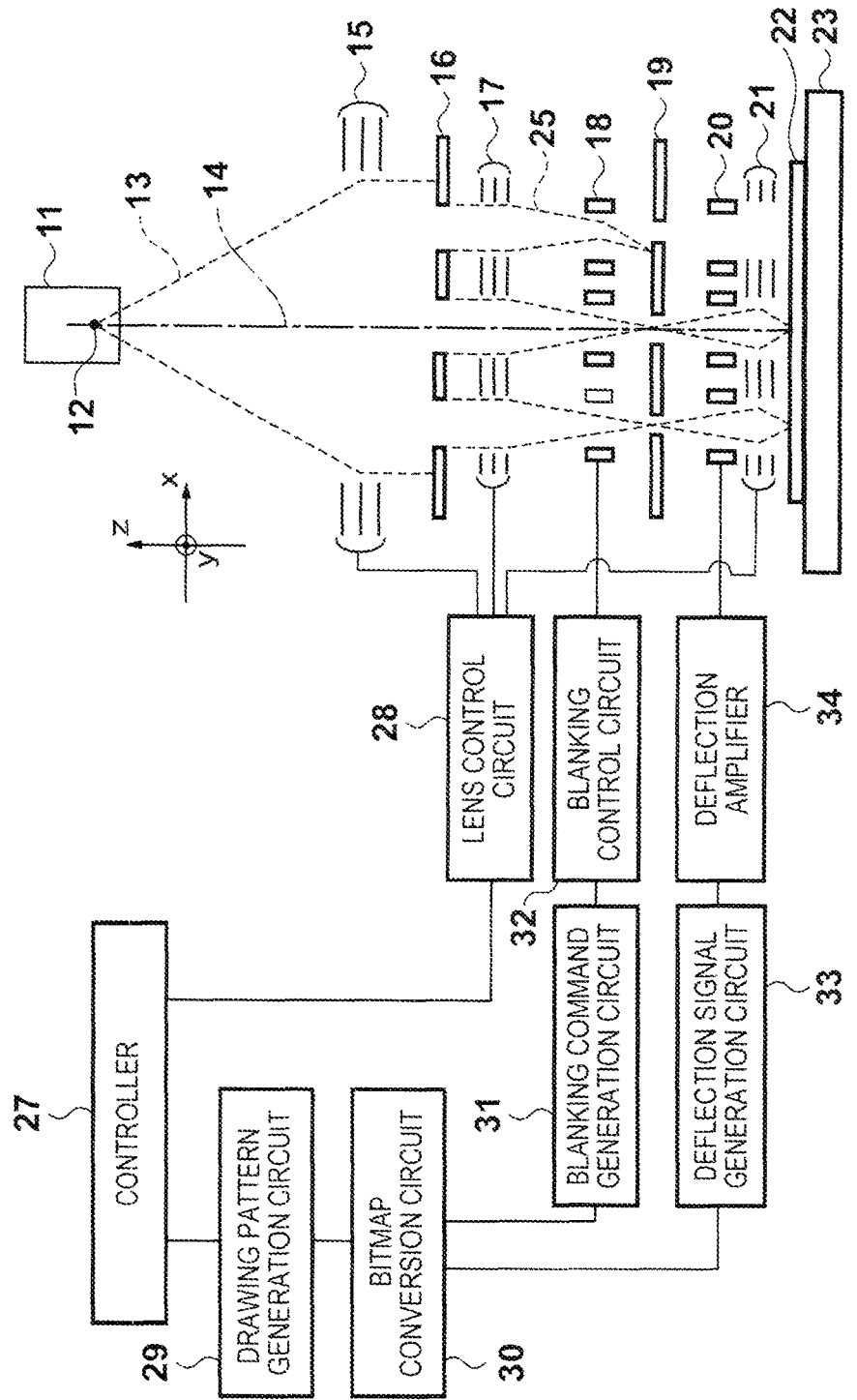
FIG. 6 is a block diagram showing the configuration of a charged particle beam drawing apparatus.
Figure 7:
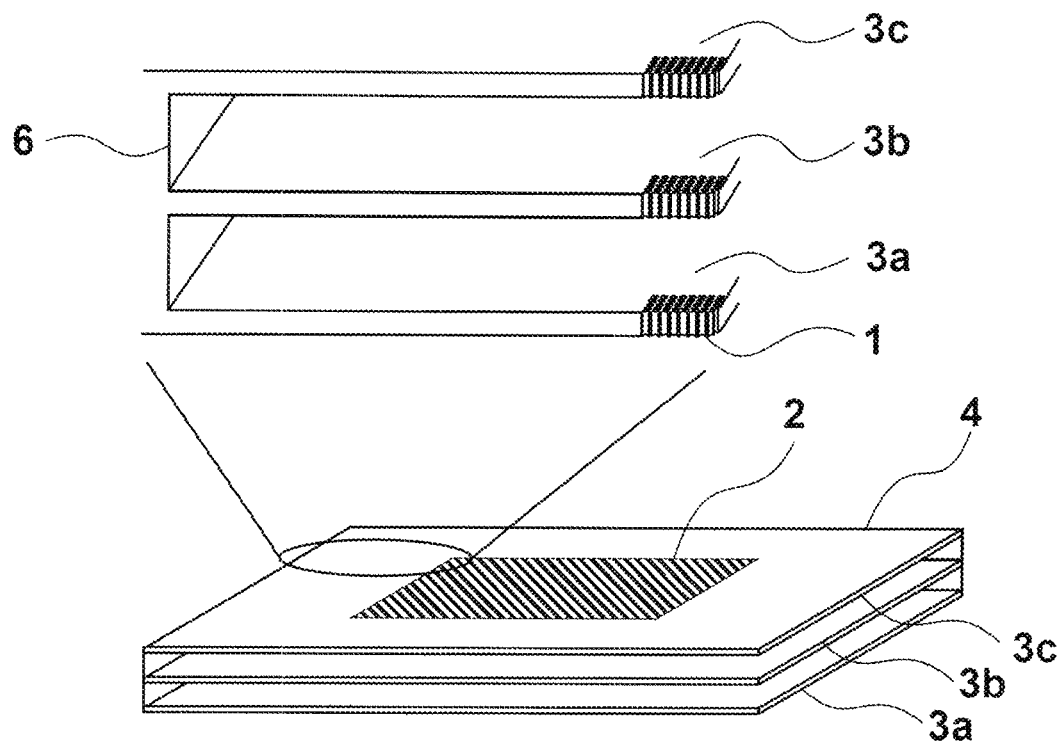
FIG. 7 is a perspective view showing an electrostatic lens in the prior art.

Although the present invention is applicable to a drawing apparatus which draws on a substrate using a plurality of charged particle beams (for example, electron beams or ion beams) under vacuum, an electron beam drawing apparatus which uses a plurality of electron beams will be described with reference to FIG. 6. Note that the path of each electron beam, including a housing of an electron optical system, is set under vacuum by, for example, a vacuum pump (not shown). An electron gun 11 forms a crossover image 12. Reference numerals 13 and 14 denote the trajectories of electron beams emerging from the crossover image 12. The electron beams emerging from the crossover image 12 are converted into a collimated beam by the action of a collimator lens 15 implemented by an electromagnetic lens, and enter an aperture array 16. The aperture array 16 includes a plurality of circular openings arrayed in a matrix, and splits the incident electron beam into a plurality of electron beams. The electron beams having passed through the aperture array 16 enter an electrostatic lens 17 formed by three electrode plates (these three electrode plates are shown as an integrated electrode plate in FIG. 6) including circular openings.

A stopping aperture 19 is formed by arraying openings in a matrix at the position at which the electrostatic lens 17 forms a crossover for the first time. A blanking deflector 18 is formed by arraying electrodes in a matrix executes the blanking operation of the electron beams in the stopping aperture 19. The blanking deflector 18 is controlled by a blanking control circuit 32, and the blanking control circuit 32 is controlled in accordance with a blanking signal generated by a drawing pattern generation circuit 29, a bitmap conversion circuit 30, and a blanking command generation circuit 31. The electron beams, having passed through the stopping aperture 19, are projected onto a substrate 22, such as a wafer or a mask, by an electrostatic lens 21 including a plurality of (for example, three) electrode plates to form an image of the original crossover image 12 on the substrate 22.

A substrate stage (stage) 23 holds the substrate 22 and can scan on the surface of the substrate 22 in a direction (Y-direction) parallel to this surface. During pattern drawing, the substrate 22 continuously moves in the Y-direction by the stage 23, and the image on the surface of the substrate 22 is deflected in the X-direction by a deflector 20 with reference to the distance measurement result of the stage 23 obtained by, for example, a laser distance measuring machine and is blanked by the blanking deflector 18. The deflector 20 is controlled by transmitting to a deflection amplifier 34 a deflection signal generated by a deflection signal generation circuit 33. The collimator lens 15, electrostatic lens 17, and electrostatic lens 21 are controlled by a lens control circuit 28, and all exposure operations are systematically controlled by a controller 27.

The drawing scheme of this drawing apparatus will be described. The electron beam 13 emitted by the electron gun 11 is split in an M (rows)×N (columns) matrix by the aperture array 16 so that its arrangement changes to a staggered pattern shifted from a grid pattern by a distance L in the X-direction. During drawing, while the stage 23 continuously moves in a second direction (Y-direction) perpendicular to a first direction (X-direction), a plurality of electron beams are repeatedly deflected by the deflector 20 for each pixel within the range of the distance L, across which they can scan on the surface of the substrate 22 in the X-direction. The distance L is determined by the deflection stroke of the deflector 20. The stage speed at this time is determined from the resist sensitivity and the value of the electron beam current density.

After the drawing apparatus draws while continuously moving the stage 23 by the distance set relative to the substrate 22 in the Y-direction, it draws while continuously moving the stage 23 in the Y-direction again upon movement of the stage 23 in steps of N rows in the Y-direction. The drawing apparatus draws while continuously moving the stage 23 in the Y-direction again upon movement of the stage 23 in steps of M rows in the X-direction at each return position on the substrate 22. By repeating this operation, a pattern can be drawn on the entire surface of the substrate 22, coated with a resist, using an electron beam. The electrostatic lens 21 placed in the last stage of the electron optical system according to the embodiment of the present invention will be described below.

[First Embodiment]

Figure 2:
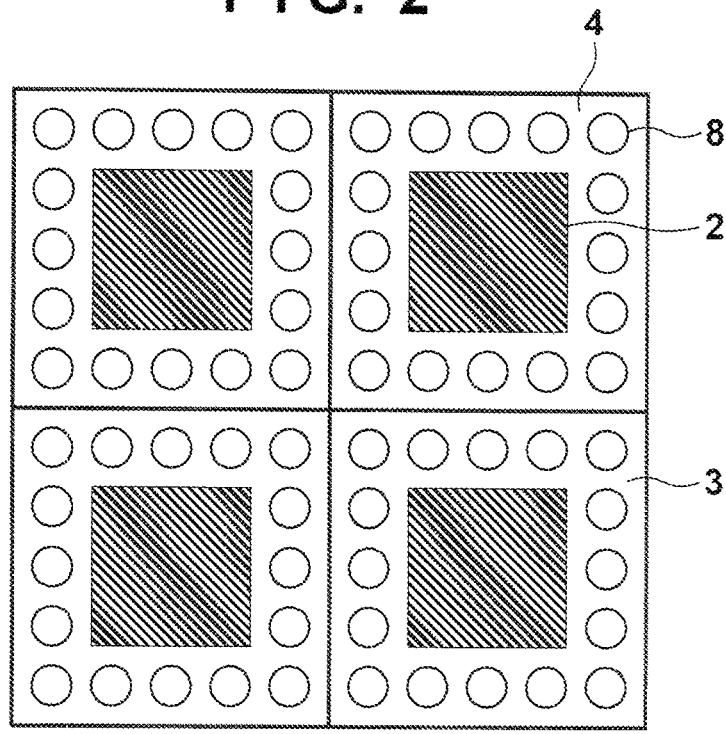
FIG. 2 is a front view showing the electrostatic lens in the first embodiment.

FIGS. 1 and 2 are views showing an electrostatic lens 21 including three electrode plates 3a, 3b, and 3c in the first embodiment. The intervals between electrode plates 3 of the electrostatic lens 21 are maintained at a predetermined interval by spacers 6 placed at the boundaries of four blocks. At least one first region 2, including a large number of first openings 1 through which a plurality of electron beams pass, is formed at the center of each block. In the first embodiment, four first regions 2 are formed. Second openings 8, different from the first openings 1, are formed in a second region 4, through which the electron beams from the electrode plates 3 do not pass, so as to surround the first region 2. In the electrode plates 3 with a block structure having a first opening group, as shown in FIGS. 1 and 2, the ratio of the total area of the first openings 1 to the area of the electrode plates 3 is about 10%. Although not shown in FIGS. 1 and 2, the resist surface of a substrate 22 is adjacent to the position below the electrode plate 3a. Further, because the electrode plates 3b and 3c are stacked, only the first openings 1 are insufficient to keep the conductance high, so it is difficult to release components outgassed from the resist to the space (upper space) opposite the electrode plate 3. Since the substrate 22 with a large area and the electrode plate 3a are opposed to each other, it is difficult to horizontally release components outgassed in their gap, resulting in a rise in pressure of the space formed between them.

Hence, the second openings 8 for releasing components outgassed from the resist irradiated with the electron beams are formed in the second region 4, through which the electron beams emerging from the electrode plates 3 that form the electrostatic lens 21 do not pass, as shown in FIGS. 1 and 2. As large a number of second openings 8 as possible are formed in the three electrode plates 3 while maintaining the structural strength of the electrode plates 3. Although each second opening 8 for releasing the outgassed components has a circular shape in FIGS. 1 and 2, it may have an elliptical or rectangular shape. As an example, when second openings 8 each having a diameter of 1 mm are arrayed around the first region 2 in a block with an area of 5 mm×5 mm, about 16 second openings 8 can be formed in one block. In this case, the conductance almost doubles, and the rise in pressure between the substrate 22 and the electrode plates 3 halves.

In one block, it is desired, as a matter of course, to increase the total area of a large number of second openings 8 formed for releasing outgassed components so as to more reliably suppress a rise in pressure. However, if the second openings 8 have the same total area, the conductance is higher when a small number of large openings are formed than when a large number of small openings are formed, so the effect of suppressing a rise in pressure is greater in the former. As in this embodiment, when the diameter of each first opening 1 is smaller than the thickness of each of the electrode plates 3a, 3b, and 3c, the first openings 1 have a cylindrical shape, so the conductance becomes relatively low. The size of each second opening 8 can be larger than the thickness of each electrode plate 3. More specifically, circular second openings 8 can have a diameter larger than the thickness of each electrode plate 3, rectangular second openings 8 can have a short side length larger than this thickness, or elliptical second openings 8 can have a minor axis length larger than this thickness.

The electrostatic lens 21 placed in the last stage of the electron optical system is normally formed by the three electrode plates 3a to 3c. When the three electrode plates 3a to 3c are arranged at an interval nearly equal to or wider than the diameter of each second opening 8 for releasing the outgassed components, even variations in position of the second openings 8 among the three electrode plates 3a to 3c have little adverse effect on passage of the outgassed components. However, as in this embodiment, when the second openings 8 are arranged at an interval of about 0.5 mm and have a diameter of about 1 mm, considerable variations in position of the second openings 8 among the electrode plates 3a to 3c adversely affect movement of gas molecules which pass through the three electrode plates 3. When at least some of the second openings 8 in the three electrode plates 3a to 3c are aligned, that is, when they form through holes, a considerable amount of outgassed molecules that can migrate to the side opposite to (above) the electrostatic lens 21 without colliding against the electrode plates 3a to 3c are present, so the exhaust efficiency improves. Hence, the second openings 8 can be aligned to form through holes in the electrode plates 3a to 3c.

[Second Embodiment]

Figure 3:
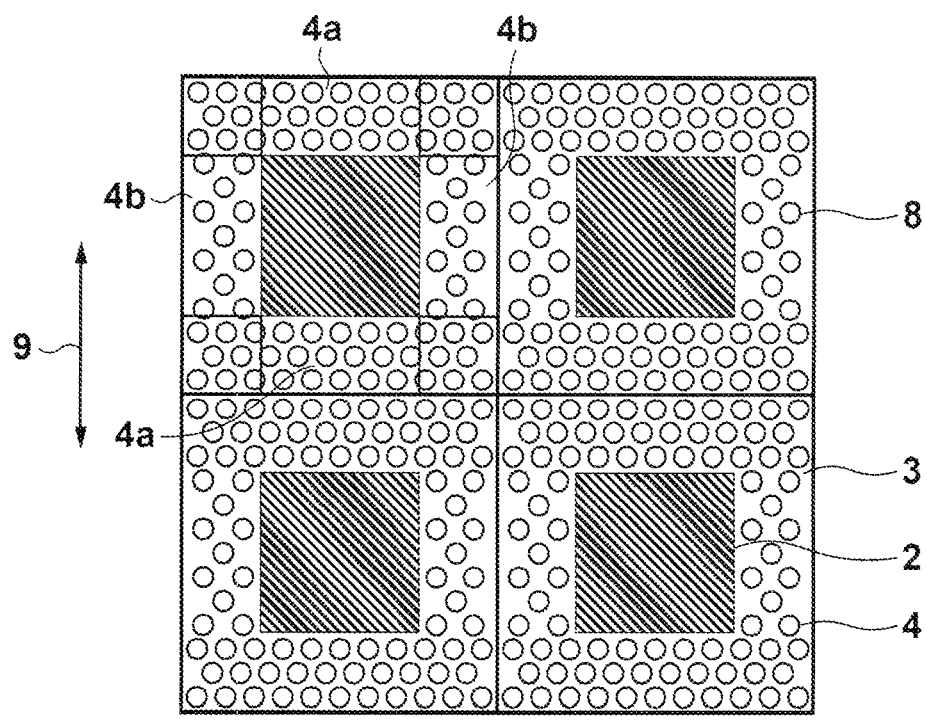
FIG. 3 is a front view showing an electrostatic lens in the second embodiment.

FIG. 3 shows an electrostatic lens 21 in the second embodiment. In the second embodiment, a large number of second openings 8 smaller than those in the first embodiment are formed in each electrode plate 3. As described in the Related Art, in drawing a pattern by multibeam irradiation, lines or dots can be formed in a substrate 22 by turning on/off each electron beam while changing its voltage using the deflection electrode of a deflector 20. This operation is defined as electron beam scanning. In this electron beam scanning, one line is drawn in a specific direction. Depending on the drawing method, a plane can be drawn using a deflector capable of scanning in a direction perpendicular to the electron beam scanning direction, but a stage 23 moves in a direction perpendicular to the electron beam scanning direction in this embodiment. This operation will be referred to as stage scanning hereinafter.

The chemical combination state of the resist on the substrate 22 irradiated with the electron beams changes upon energy irradiation, and then some components of the resist vaporize and are outgassed. This phenomenon starts as soon as the resist is irradiated with electron beams, so a chain reaction progresses in, for example, a chemical amplification resist and therefore progresses even after the end of electron beam irradiation. Hence, some molecules vaporize from the resist even after it is irradiated with the electron beams. Further, the resist has a thickness of, for example, about 50 nm, and brings about a reaction not only on the surface but also in a region close to the substrate 22. The molecules vaporized in the resist at this time migrate through the resist, separate from the surface, and are released after electron beam irradiation as well. In this manner, outgassing from the resist starts during electron beam drawing as soon as the resist is irradiated with electron beams, and continues for a certain time even after the irradiation. Hence, unless these outgassed components are appropriately released, the pressure in the space on the resist surface rises. Of a second region 4, regions 4a along a scanning direction 9 of the stage 23 generate and collect a larger amount of components outgassed from the resist than regions 4b along a direction perpendicular to the scanning direction 9, due to the local distribution of components outgassed upon the resist irradiation. The regions 4a are adjacent to a plurality of first openings 1 in the scanning direction of the stage 23, and the regions 4b are adjacent to the plurality of first openings 1 in a direction perpendicular to the scanning direction of the stage 23.

In this embodiment, the first region 2 through which a plurality of electron beams pass has a rectangular shape surrounded by a pair of first sides parallel to a second direction (the scanning direction 9 of the stage 23), and a pair of second sides parallel to the second direction perpendicular to a first direction. Of the second region 4, the regions 4a, having a predetermined width in the second direction from the second sides, include second openings 8 with a proportion (area density) higher than that of second openings 8 in the regions 4b, having the predetermined width in the first direction from the first sides. This makes it possible to efficiently release to the side opposite to (above) the electrostatic lens 21 components outgassed from the resist irradiated with the electron beams. Hence, a decrease in rigidity of the electrode plates 3 upon the formation of a large number of second openings 8 in the regions 4a along the second direction parallel to the scanning direction 9 can be compensated for by forming a relatively small number of second openings 8 in the regions 4b along the first direction perpendicular to the scanning direction 9.

[Third Embodiment]

Figure 4:
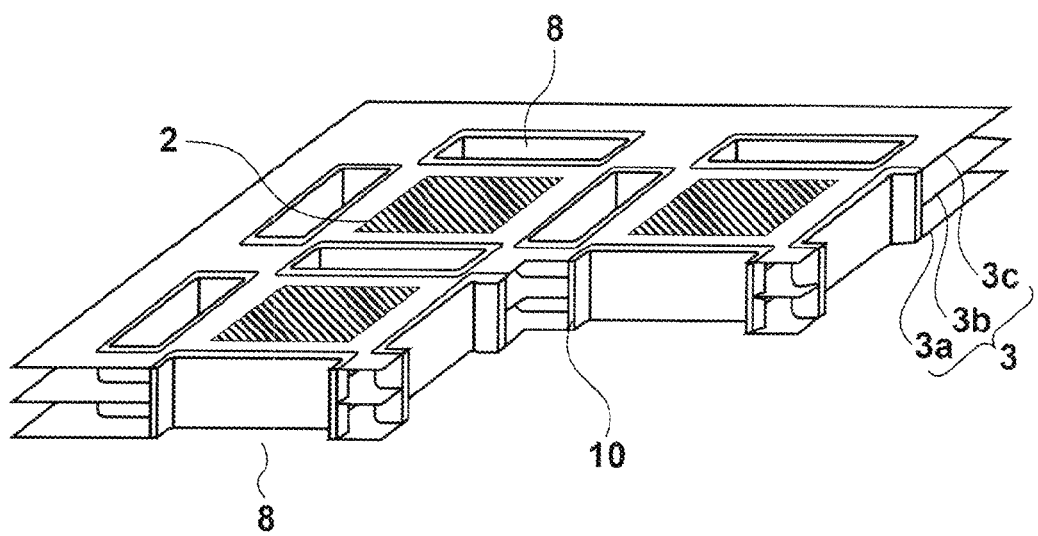
FIG. 4 is a perspective view showing an electrostatic lens in the third embodiment.
Figure 5:
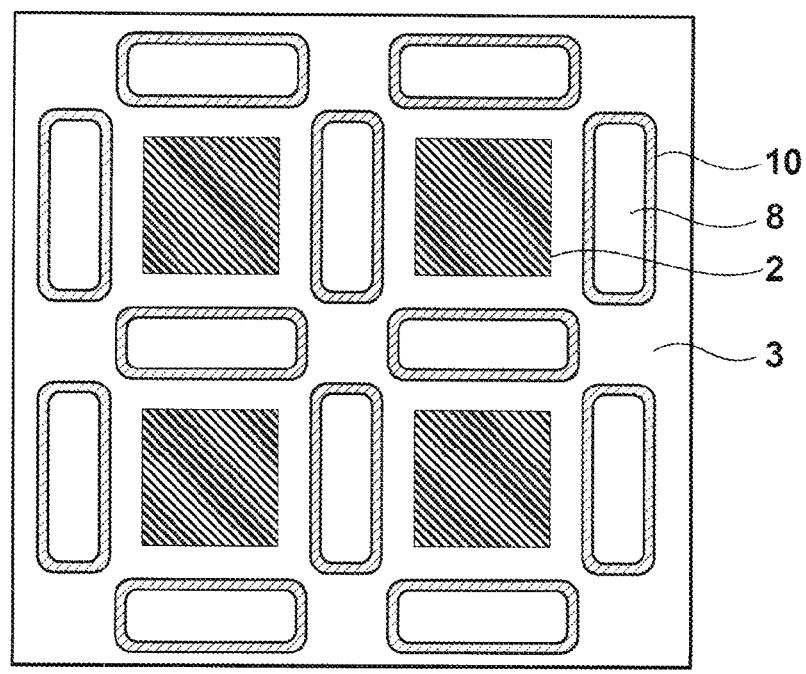
FIG. 5 is a front view showing the electrostatic lens in the third embodiment.

An electrostatic lens 21 in the third embodiment will be described next with reference to FIGS. 4 and 5. This embodiment provides an example in which ducts 10 extend through three electrode plates 3, and second openings 8 considerably larger than those in the first and second embodiments are zoned by the inner side surfaces of the ducts 10. The ducts 10 support the three electrode plates 3 while keeping a predetermined interval between them. At this time, the ducts 10 serve as spacers which support the electrode plates 3 to leave vacant spaces between them, so the ducts 10 are made of an insulating material. Further, a potential difference of, for example, about 5 kV is generated in the electrode plates 3 which form the electrostatic lens 21, so the ducts 10 must have an insulating resistance high enough to withstand a voltage generated by this potential difference. A material which causes little outgassing, such as glass or ceramics, can be used for the ducts 10. Placing such ducts 10 allows components outgassed from the resist to pass through the electrostatic lens 21 without entering the gaps between the electrode plates 3 of the electrostatic lens 21. The ducts 10 can prevent not all outgassed components from entering first openings 1, but nonetheless can keep the amount of outgassed components entering the first openings 1 small. The second openings 8 are arranged between and around first regions 2 in the block arrangement. Each second opening 8 has a size of, for example, 2 mm×6 mm. When such large second openings 8 can be formed, the conductance of the electrostatic lens 21 can be increased. Therefore, the rise in pressure due to components outgassed from the gap between a substrate 22 and the electrode plate 3 can be kept about one order of magnitude less than that when no second openings 8 are present. Insulators may be placed as support members or spacers for the electrode plates 3 independently of the ducts 10 in this embodiment.

According to the first to third embodiments, it is possible to prevent components outgassed from the resist from remaining in the space between the resist and the electrode plate 3 that forms the electrostatic lens 21. This produces an effect of suppressing adhesion of carbon contamination (contaminants) to the electrode plates 3. It is also possible to keep the rise in pressure between the electrode plates due to outgassing from the resist so as to decrease the possibility of discharge.

[Method of Manufacturing Article]

A method of manufacturing an article according to an embodiment of the present invention is suitable for manufacturing an article such as a microdevice, e.g. a semiconductor device, or an element which has a microstructure. This method can include a step of forming a latent image pattern on a photosensitive agent, coated on a substrate, using the above-mentioned drawing apparatus (a step of drawing on a substrate), and a step of developing the substrate having the latent image pattern formed on it in the forming step. This method can also include subsequent known steps (for example, oxidation, film formation, vapor deposition, doping, planarization, etching, resist removal, dicing, bonding, and packaging). The method of manufacturing an article according to this embodiment is more advantageous than the conventional methods in at least one of: performance/quality/productivity/manufacturing cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-177251 filed Aug. 12, 2011, which is hereby incorporated by reference herein in its entirety.

What is claimed is:

1. A drawing apparatus which performs drawing on a substrate with a plurality of charged particle beams in vacuum, the apparatus comprising:

a substrate stage configured to hold the substrate and to be moved in a scanning direction;

an electrostatic lens including an electrode member to be opposed to the substrate, and configured to project the plurality of charged particle beams onto the substrate via the electrode member, wherein in the electrode member are formed a plurality of first openings via which the plurality of charged particle beams pass, and a plurality of second openings, via which a charged particle beam of the plurality of charged particle beam do not pass, different from the plurality of first openings, the plurality of second openings being adjacent to the plurality of first openings in the scanning direction, a total area of the plurality of second openings being not smaller than a total area of the plurality of first openings.

2. A drawing apparatus which performs drawing on a substrate with a plurality of charged particle beams in vacuum, the apparatus comprising:

an electrostatic lens including an electrode member, and configured to project the plurality of charged particle beams onto the substrate via the electrode member, wherein in the electrode member are formed a plurality of first openings via which the plurality of charged particle beams pass, and a plurality of second openings, via which a charged particle beam of the plurality of charged particle beam do not pass, different from the plurality of first openings, a total area of the plurality of second openings being not smaller than a total area of the plurality of first openings, the electrostatic lens includes a plurality of the electrode member and a plurality of ducts which extend through the plurality of the electrode member, the plurality of ducts are made of an insulating material, and the plurality of second openings are respectively zoned by inner side surfaces of the plurality of ducts.

3. A drawing apparatus which performs drawing on a substrate with a plurality of charged particle beams in vacuum, the apparatus comprising:

a substrate stage configured to hold the substrate and to be moved in a scanning direction;

an electrostatic lens including an electrode member, and configured to project the plurality of charged particle beams onto the substrate via the electrode member, wherein in the electrode member are formed a plurality of first openings via which the plurality of charged particle beams pass, and a plurality of second openings, via which a charged particle beam of the plurality of charged particle beam do not pass, different from the plurality of first openings, a total area of the plurality of second openings being not smaller than a total area of the plurality of first openings, an area density of the plurality of second openings adjacent to the plurality of first openings in the scanning direction is higher than an area density of the plurality of second openings adjacent to the plurality of first openings in a direction perpendicular to the scanning direction.

4. The apparatus according to claim 1, wherein an area of each of the plurality of second openings is larger than an area of each of the plurality of first openings.

5. A method of manufacturing an article, the method comprising:

performing drawing on a substrate using a drawing apparatus;

developing the substrate on which the drawing has been performed; and processing the developed substrate to manufacture the article, wherein the drawing apparatus performs the drawing on the substrate with a plurality of charged particle beams, the apparatus including:

an electrostatic lens including an electrode member, and configured to project the plurality of charged particle beams onto the substrate via the electrode member, wherein in the electrode member are formed a plurality of first openings via which the plurality of charged particle beams pass, and a plurality of second openings, via which a charged particle beam of the plurality of charged particle beam do not pass, different from the plurality of first openings, a total area of the plurality of second openings being not smaller than a total area of the plurality of first openings, the electrostatic lens includes a plurality of the electrode member and a plurality of ducts which extend through the plurality of the electrode member, the plurality of ducts are made of an insulating material, and the plurality of second openings are respectively zoned by inner side surfaces of the plurality of ducts.

6. A method of manufacturing an article, the method comprising:

performing drawing on a substrate using a drawing apparatus;

developing the substrate on which the drawing has been performed; and processing the developed substrate to manufacture the article, wherein the drawing apparatus performs the drawing on the substrate with a plurality of charged particle beams, the apparatus including:

an electrostatic lens including an electrode member and configured to project the plurality of charged particle beams onto the substrate via the electrode member, wherein in the electrode member are formed a plurality of first openings via which the plurality of charged particle beams pass, and a second opening, via which a charged particle beam of the plurality of charged particle beam do not pass, different from the plurality of first openings, a conductance of the second opening being not lower than a total conductance of the plurality of first openings, an area density of the plurality of second openings adjacent to the plurality of first openings in the scanning direction is higher than an area density of the plurality of second openings adjacent to the plurality of first openings in a direction perpendicular to the scanning direction.

7. The apparatus according to claim 2, wherein an area of each of the plurality of second openings is larger than an area of each of the plurality of first openings.

8. The apparatus according to claim 3, wherein an area of each of the plurality of second openings is larger than an area of each of the plurality of first openings.

9. A method of manufacturing an article, the method comprising:

performing drawing on a substrate using a drawing apparatus;

developing the substrate on which the drawing has been performed; and processing the developed substrate to manufacture the article, wherein the drawing apparatus performs the drawing on the substrate with a plurality of charged particle beams, the apparatus including:

a substrate stage configured to hold the substrate and to be moved in a scanning direction;

an electrostatic lens including an electrode member, and configured to project the plurality of charged particle beams onto the substrate via the electrode member, p1 wherein in the electrode member are formed a plurality of first openings via which the plurality of charged particle beams pass, and a plurality of second openings, via which a charged particle beam of the plurality of charged particle beam do not pass, different from the plurality of first openings, the plurality of second openings being adjacent to the plurality of first openings in the scanning direction, a total area of the plurality of second openings being not smaller than a total area of the plurality of first openings.

* * * * *